US012488970B2

(12) United States Patent
Kojima et al.

(10) Patent No.: US 12,488,970 B2
(45) Date of Patent: Dec. 2, 2025

(54) FILM FORMING APPARATUS AND METHOD OF CONTROLLING FILM FORMING APPARATUS

(71) Applicant: TOKYO ELECTRON LIMITED, Tokyo (JP)

(72) Inventors: Yasuhiko Kojima, Yamanashi (JP); Shota Ishibashi, Yamanashi (JP); Toru Kitada, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 18/350,400

(22) Filed: Jul. 11, 2023

(65) Prior Publication Data

US 2024/0021423 A1 Jan. 18, 2024

(30) Foreign Application Priority Data

Jul. 15, 2022 (JP) ................................ 2022-114359

(51) Int. Cl.

*H01J 37/34* (2006.01)
*C23C 14/34* (2006.01)
*C23C 14/35* (2006.01)
*C23C 14/50* (2006.01)
*H01J 37/32* (2006.01)

(52) U.S. Cl.

CPC ...... *H01J 37/3455* (2013.01); *C23C 14/3407* (2013.01); *C23C 14/352* (2013.01); *C23C 14/505* (2013.01); *H01J 37/32715* (2013.01); *H01J 37/3429* (2013.01); *H01J 2237/332* (2013.01)

(58) Field of Classification Search

CPC ............ H01J 37/3455; H01J 37/32715; H01J 37/3429; H01J 2237/332; H01J 37/3405; H01J 37/3417; C23C 14/3407; C23C 14/352; C23C 14/505; C23C 14/3464

See application file for complete search history.

(56) References Cited

U.S. PATENT DOCUMENTS 4,279,726 A * 7/1981 Baird .................. C23C 14/3464 204/192.26
5,907,220 A * 5/1999 Tepman .................. C23C 14/35 315/111.41
2005/0196632 A1* 9/2005 Maschwitz ............ B32B 27/32 428/615

(Continued)

FOREIGN PATENT DOCUMENTS

JP 2020-026559 A 2/2020
JP 2021-165422 A 10/2021

(Continued)

*Primary Examiner* — Patrick S Ott
(74) *Attorney, Agent, or Firm* — Fenwick & West LLP

(57) ABSTRACT

There is a film forming apparatus comprising: a first holder holding a first target formed of a first material; a second holder holding a second target formed of a second material different from the first material; and a mounting table holding a substrate, the mounting table rotatable with a central axis of the mounting table as a rotation axis, wherein a distance from the central axis of the mounting table to a center of a sputter surface of the first target is different from a distance from the central axis of the mounting table to a center of a sputter surface of the second target.

4 Claims, 3 Drawing Sheets

(56) References Cited

U.S. PATENT DOCUMENTS

2010/0213047 A1* 8/2010 Nagamine ........... C23C 16/4586
204/192.12
2012/0152727 A1* 6/2012 Kwak ..................... H01J 37/34
204/192.15
2012/0193216 A1* 8/2012 Endo ....................... H01J 37/34
204/192.1
2013/0048494 A1* 2/2013 Kikuchi ................. H10N 50/01
204/298.13
2014/0141624 A1* 5/2014 Abarra .................. C23C 14/225
204/298.11
2015/0114835 A1* 4/2015 Gomi .................. H01J 37/3447
204/298.08
2018/0057928 A1* 3/2018 Yamamoto ............ H01J 37/345
2020/0266063 A1* 8/2020 Toshima ............. H01L 21/0337
2022/0044920 A1 2/2022 Abarra et al.

FOREIGN PATENT DOCUMENTS

JP 2022-029532 A 2/2022
WO WO 2018/084186 A1 5/2018

* cited by examiner

FILM FORMING APPARATUS AND METHOD OF CONTROLLING FILM FORMING APPARATUS

CROSS-REFERENCE TO RELATED APPLICATIONS

This application claims priority to Japanese Patent Application No. 2022-114359, filed on Jul. 15, 2022, the entire contents of which are incorporated herein by reference.

TECHNICAL FIELD

The present disclosure relates to a film forming apparatus and a method of controlling the film forming apparatus.

BACKGROUND

Japanese Laid-open Patent Publication No. 2022-29532 discloses a sputtering apparatus having a plurality of targets.

SUMMARY

In one aspect, the present disclosure provides a film forming apparatus that simultaneously sputters targets of different materials to improve in-plane uniformity of film thickness and composition, and a method of controlling the film forming apparatus.

In accordance with an aspect of the present disclosure, there is a film forming apparatus comprising: a first holder holding a first target formed of a first material; a second holder holding a second target formed of a second material different from the first material; and a mounting table holding a substrate, the mounting table rotatable with a central axis of the mounting table as a rotation axis, wherein a distance from the central axis of the mounting table to a center of a sputter surface of the first target is different from a distance from the central axis of the mounting table to a center of a sputter surface of the second target.

DETAILED DESCRIPTION

Figure 1:
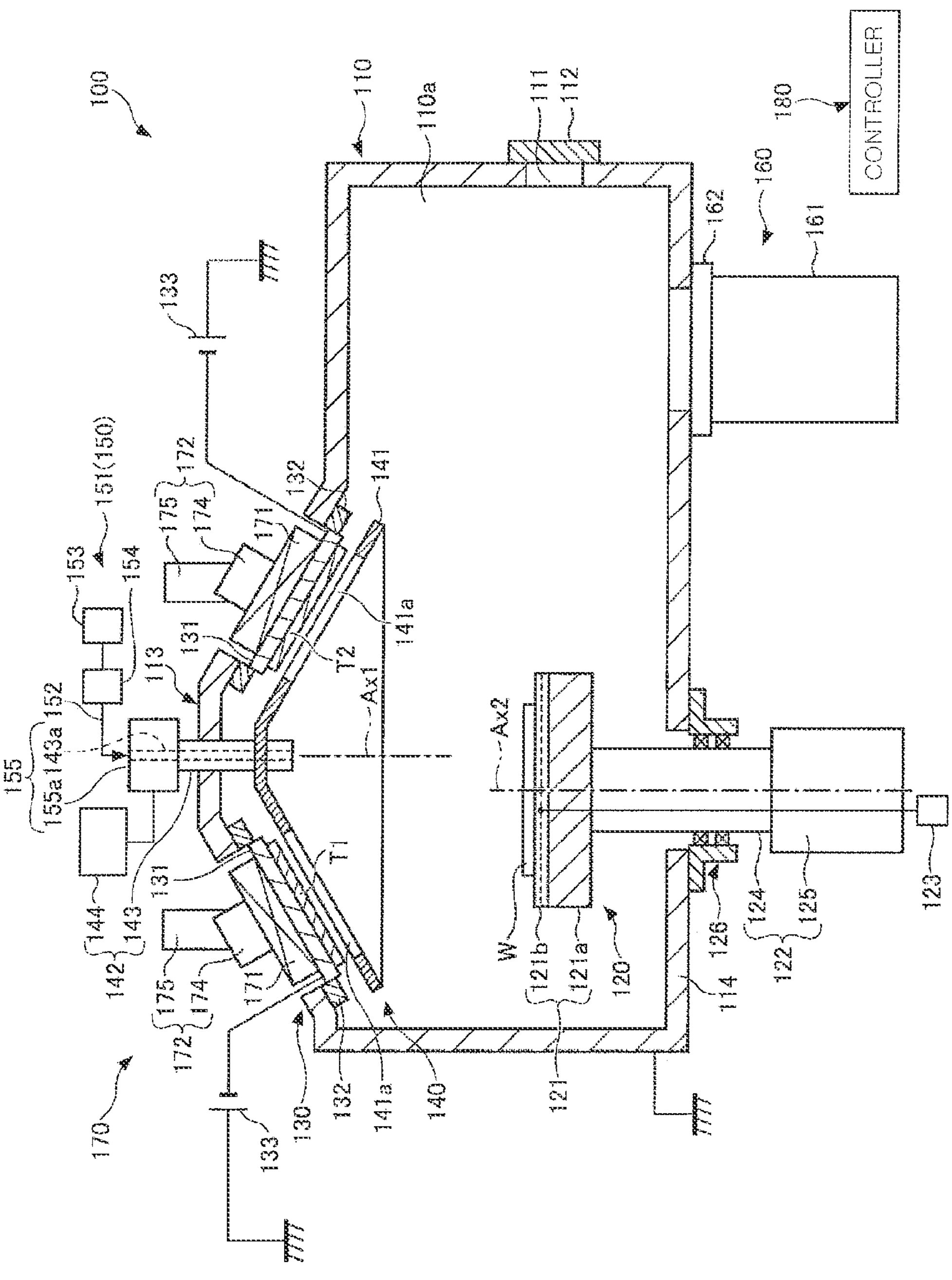
FIG. 1 is an example of a schematic cross-sectional view of a film forming apparatus.

Hereinafter, embodiments of the present disclosure will be described with reference to the drawings. In each drawing, the same components are denoted by the same reference numerals, and redundant description may be omitted.

A film forming apparatus (a substrate processing apparatus, a sputtering apparatus) 100 will be described with reference to FIG. 1. FIG. 1 is an example of a schematic cross-sectional view of the film forming apparatus 100. The film forming apparatus 100 is a PVD (Physical Vapor Deposition) apparatus, and is a sputtering apparatus for forming a film by adhering (depositing) sputter particles (film forming atoms) emitted from targets T1 and T2 onto a surface of a substrate W such as a semiconductor wafer mounted on a mounting table 12 in a processing chamber 110. In addition, the film forming apparatus 100 is a sputtering apparatus that forms a compound film onto the substrate W by using a co-sputtering (simultaneous sputtering) technique of simultaneously sputtering the targets T1 and T2 of different materials.

The film forming apparatus 100 includes a processing chamber 110 having an internal space 110*a* for performing film formation processing onto the substrate W. In addition, the film forming apparatus 100 has a configuration for performing film formation processing onto the substrate W within the processing chamber 110, and includes a stage mechanism portion 120, a target holding portion 130, a target covering portion 140, a gas supply portion 150, a gas discharge portion 160, and a magnet mechanism portion 170. Further, the film forming apparatus 100 has a controller 180 that controls an operation of each component.

The processing chamber 110 included in the film forming apparatus 100 is made of, for example, aluminum. The processing chamber 110 is connected to ground potential. In other words, the processing chamber 110 is grounded. The processing chamber 110 includes a loading/unloading port 111 that communicates the internal space 110*a* with an outside of the processing chamber 110, and a gate valve 112 that opens and closes the loading/unloading port 111. When the gate valve 112 is opened, the film forming apparatus 100 loads and unloads the substrate W through the loading/unloading port 111 by a transport device (not shown). In addition, the processing chamber 110 has a pyramid portion 113 having a substantially pyramid shape (for example, a substantially quadrangular pyramid shape, a conical shape, or the like) on a ceiling portion located above the stage mechanism portion 120.

In addition, the film forming apparatus 100 has a target central axis Ax1 and a mounting table central axis Ax1.

The target central axis Ax1 is an axis that is rotationally symmetrical between the targets T1 and T2. In other words, the target central axis Ax1 is an axis in which the distance from the target T1 to the target central axis Ax1 is the same as the distance from the target T2 to the target central axis Ax1. In addition, the target central axis Ax1 passes through the center (apex) of the pyramid portion 113.

The mounting table central axis Ax2 is an axis that passes through the center of the substrate W mounted on the stage mechanism portion 120 and extends along a vertical direction. Further, the mounting table central axis Ax2 is a rotation axis when the substrate W rotates.

The stage mechanism portion 120 includes a mounting table 121 disposed within the processing chamber 110, and a support driving portion 122 that operably supports the mounting table 121. The mounting table 121 includes a substantially disk-shaped base portion 121*a* and an electrostatic chuck 121*b* fixed on the base portion 121*a*.

The base portion 121*a* is made of, for example, aluminum. The base portion 121*a* is fixed to an upper end of the support driving portion 122. By moving the base portion 121*a* by the support driving portion 122, the electrostatic chuck 121*b* is disposed at a predetermined height position of the internal space 110*a*. In addition, the stage mechanism portion 120 may include a temperature control mechanism (not shown) that adjusts a temperature of the base portion 121*a* to control a temperature of the substrate W mounted on the mounting table 121.

The electrostatic chuck 121*b* includes a dielectric film and an electrode provided in an inner layer of the dielectric film (both not shown). A DC power supply 123 is connected to the electrode of the electrostatic chuck 121*b*. The electrostatic chuck 121*b* electrostatic-suctions the substrate W mounted on an upper surface of the electrostatic chuck 121*b* by generating an electrostatic force in the dielectric film by a DC voltage supplied to the electrode from the DC power supply 123. The center of the upper surface of the electrostatic chuck 121*b* (the mounting surface of the substrate W) coincides with the mounting table central axis Ax2.

The support driving portion 122 has a columnar support shaft 124 that holds the base portion 121*a*, and an operating device 125 that operates the support shaft 124. The support shaft 124 extends in a vertical direction and extends from the inner space 110*a* of the processing chamber 110 to an outside of the processing chamber 110 through a bottom portion 114. The shaft center of the support shaft 124 overlaps with the mounting table central axis Ax2.

The operating device 125 is provided outside the processing chamber 110. The operating device 125 holds a lower end side of the support shaft 124. The operating device 125 rotates the support shaft 124 around the mounting table central axis Ax2 based on the control of the controller 180. In addition, the operating device 125 vertically moves up and down (up and down movement) a mounting table 121. The mounting table 121 rotates and moves up and down within the processing chamber 110 by the operation of the operating device 125.

In addition, the stage mechanism portion 120 includes a sealing structure 126 that seals the gap between the bottom portion 114 of the processing chamber 110 and the support shaft 124 while making the support shaft 124 operable. For example, a magnetic fluid seal may be applied as the sealing structure 126.

The target holding portion 130 of the film forming apparatus 100 holds a plurality of targets T1 and T2, which are cathode targets, at positions spaced upward from the mounting table 121. The film forming apparatus 100 shown in FIG. 1 includes two target holding portions 130. One target holding portion 130 includes a metal holder (first holder) 131 that holds the target (first target) T1, and an insulating member 132 that fixes an outer peripheral portion of the holder 131 and supports the holder 131. Similarly, the other target holding portion 130 includes a metal holder (second holder) 131 that holds the target (second target) T2, and the insulating member 132 that fixes an outer peripheral portion of the holder 131 and supports the holder 131.

The targets T1 and T2, respectively held by the holder 131, are formed of a material having a substance for film formation. Each of the targets T1 and T2 is a rectangular flat plate.

The target T1 is formed of a first material. The target T2 is formed of a second material different from the first material. In the following description, the description is made assuming that the target T1 is formed of a material containing silicon (Si), the target T2 is formed of a material containing tungsten (W), and the film forming apparatus 100 forms a tungsten silicide (WSi) film on the substrate W. The tungsten silicide (WSi) film may, for example, be used as a hard mask.

Each of the holders 131 is formed in a rectangular shape that is one size larger than the targets T1 and T2 in a plan view. Each of the holders 131 is fixed to an inclined surface of the pyramid portion 113 through the insulating member 132. Since each of the holders 131 is fixed to the inclined surface of the pyramid portion 113, each of the holders 131 holds the surfaces of the targets T1 and T2 (sputter surfaces exposed in the internal space 110*a*) in an inclined state with respect to the target central axis Ax1.

In addition, one target holding portion 130 has a power supply (first power supply) 133 that applies a negative DC voltage to the holder 131 that holds the target T1. Similarly, the other target holder 130 has a power supply (second power supply) 133 that applies a negative DC voltage to the holder 131 that holds the target T2. In addition, the power supply 133 may be a single power supply that selectively applies a voltage to each of the targets T1 and T2.

Figure 2:
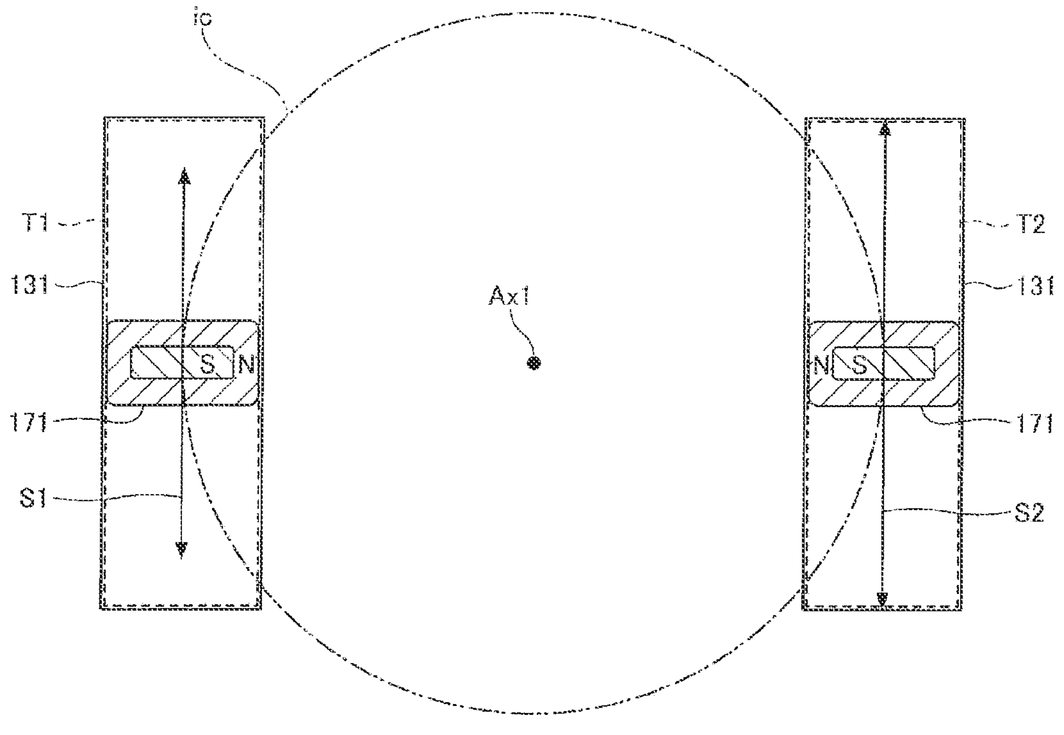
FIG. 2 is an example of a schematic plane view showing the arrangement of two holders and two magnets of a film forming apparatus.

FIG. 2 is an example of a schematic plane view showing the arrangement of two holders 131 and two magnets 171 of the film forming apparatus 100. As shown in FIG. 2, the target holding portion 130 evenly disposes a plurality of the holders 131 (and the targets T1 and T2) along a virtual circle ic centered on the target central axis Ax1. In other words, each of the two holders 131 (and the targets T1 and T2) is disposed on the virtual circle ic at intervals of an angle of 180 degrees. In addition, each of the two holders 131 (and the targets T1 and T2) is provided such that a long side of the holder 131 extends parallel to a tangent line of the virtual circle ic. Each of the two targets T1 and T2 is held at the same position as the holder 131 so as to face obliquely downward (see also FIG. 3).

Referring to FIG. 1, the target covering portion 140 of the film forming apparatus 100 has a shutter main body 141 disposed within the processing chamber 110 and a shutter driving portion 142 supporting the shutter main body 141 in an operable manner.

The shutter main body 141 is provided between the targets T1 and T2 and the mounting table 121. The shutter main body 141 is formed in a pyramid shape substantially parallel to an inclined surface of the pyramid portion 113 of the processing chamber 110. The shutter main body 141 may face sputter surfaces of the targets T1 and T2. The shutter main body 141 also has two openings 141*a* that are slightly larger than the targets T1 and T2. The shutter main body 141 has the two openings 141*a* evenly disposed along a virtual circle ic centered on the target central axis Ax1. In other words, each of the two openings 141*a* is disposed on the virtual circle ic at intervals of an angle of 180 degrees. In addition, each of the two openings 141*a* is provided such that a long side of the opening 141*a* extends parallel to a tangent line of the virtual circle ic.

The shutter driving portion 142 includes a columnar rotary shaft 143 and a rotating portion 144 that rotates the rotary shaft 143. The axis of the rotary shaft 143 overlaps with the target central axis Ax1 of the processing chamber 110. The rotary shaft 143 extends along a vertical direction and fixes the center (apex) of the shutter main body 141 at its lower end. The rotary shaft 143 protrudes outside the processing chamber 110 through the center of the pyramid portion 113.

The rotating portion 144 is provided outside the processing chamber 110, and rotates the rotary shaft 143 relative to an upper end (connector 155*a*) holding the rotary shaft 143 through a rotation transmission portion (not shown). As a result, the rotary shaft 143 and the shutter main body 141 rotate around the target central axis Ax1.

When sputtering is performed, the target covering portion 140 adjusts a circumferential position of the openings 141*a* based on the control of the controller 180, so that one opening 141*a* faces the target T1 and the other opening 141*a* faces the target T2. This exposes a sputter surface of the target T1 and a sputter surface of the target T2. In addition, the target covering portion 140 adjusts a circumferential position of the opening 141*a* based on the control of the controller 180, and rotates the same by 90° from the aforementioned position, thereby covering the sputter surface of the target T1 and the sputter surface of the target T2.

The gas supply portion 150 of the film forming apparatus 100 includes an excitation gas portion 151 that is provided in the pyramid portion 113 and supplies an excitation gas.

The excitation gas portion 151 includes a pipe 152 for circulating gas outside the processing chamber 110. The excitation gas portion 151 also includes a gas source 153, a flow controller 154, and a gas introduction portion 155 in order from an upstream side to a downstream side of the pipe 152.

The gas source 153 stores an excitation gas (for example, argon gas). The gas source 153 supplies gas to the pipe 152. A mass flow controller or the like is applied to the flow controller 154, for example, and adjusts a flow rate of the gas supplied into the processing chamber 110. The gas introduction portion 155 introduces gas from the outside of the processing chamber 110 into the inside. The gas introduction portion 155 is configured of a connector 155*a* connected to the pipe 152 outside the processing chamber 110, and a gas passage 143*a* formed in the rotary shaft 143 of the target covering portion 140.

The gas discharge portion 160 provided in the film forming apparatus 100 includes a decompression pump 161, and an adapter 162 for fixing the decompression pump 161 to the bottom portion 114 of the processing chamber 110. The gas discharge portion 160 decompresses the internal space 110*a* of the processing chamber 110 under the control of the controller 180.

The magnet mechanism portion 170 provided in the film forming apparatus 100 applies a magnetic field to each of the targets T1 and T2. The magnet mechanism portion 170 applies a magnetic field to each of the targets T1 and T2, so that the magnet mechanism portion 170 induces plasma to the targets T1 and T2. The magnet mechanism portion 170 includes a magnet 171 (cathode magnet) and an operation portion 172 that operably holds the magnet 171 for each of the plurality of holders 131. In other words, one magnet mechanism portion 170 includes a magnet (a first magnet) 171 disposed on a back surface of the holder 131 that holds the target T1, and an operation portion (a first operation portion) 172 that operably holds the magnet 171. Similarly, the other magnet mechanism portion 170 includes a magnet (a second magnet) 171 disposed on a back surface of the holder 131 that holds the target T2, and an operation portion (a second operation portion) 172 that operably holds the magnet 171.

The two magnets 171 are disposed so as to overlap with the targets T1 and T2 on the virtual circle ic.

Each of the magnets 171 is formed in the same shape. Further, each of the magnets 171 generates magnetic force of the same degree as each other. Specifically, each of the magnets 171 has a substantially rectangular shape in a plan view. In the holding state of the operation portion 172, a long side of the magnet 171 extends parallel to a lateral direction of the rectangular targets T1 and T2, while a short side of the magnet 171 extends parallel to a longitudinal direction of the rectangular targets T1 and T2.

Each of the magnets 171 may apply a permanent magnet. The material forming each of the magnets 171 is not particularly limited as long as it has an appropriate magnetic force, and examples thereof include iron, cobalt, nickel, samarium, and neodymium.

The operation portion 172 holding each of the magnets 171 reciprocates/oscillates the held magnets 171 along a longitudinal direction of the targets T1 and T2. In other words, the magnet 171 is provided movably. Further, the operation portion 172 holding each of the magnets 171 separates and brings together the held magnets 171 from the targets T1 and T2. Specifically, each of the operation portions 172 includes a reciprocating mechanism 174 that holds the magnet 171 and reciprocates the magnet 171, and a contact and separation mechanism 175 that holds the reciprocating mechanism 174 and moves the reciprocating mechanism 174 away from and close to the targets T1 and T2.

The controller 180 is composed of a computer and controls each component of the film forming apparatus 100. The controller 180 has a main controller composed of a CPU that actually performs these controls, an input device, an output device, a display device, and a storage device. The storage device stores parameters of various processes executed in the film forming apparatus 100, and a storage medium in which a program, i.e., a processing recipe, for controlling the processes executed by the film forming apparatus 100 is stored is set. The main controller of the controller 180 calls a predetermined processing recipe stored in the storage medium, and causes the film forming apparatus 100 to execute a predetermined process based on the processing recipe.

Next, an example of film formation processing using the film formation apparatus 100 will be described. In addition, the inside of the processing chamber 110 is vacuum exhausted to a predetermined vacuum level by the gas discharge portion 160.

First, the controller 180 prepares the substrate W on the mounting table 121. Specifically, the controller 180 opens the gate valve 112. The substrate W is loaded into the processing chamber 110 through the loading/unloading port 111 by a transport device (not shown) and mounted on the mounting table 121. The controller 180 controls a power supply (not shown) of the electrostatic chuck 121*b* to electrostatic-suction the substrate W to the mounting table 121. When the transport device retreats from the loading/unloading port 111, the controller 180 closes the gate valve 112. Further, the controller 180 controls the support driving portion 122 to raise the mounting table 121 to a predetermined height position.

Next, the controller 180 performs film formation processing on the substrate W. Specifically, the controller 180 controls the support driving portion 122 to rotate the mounting table 121 holding the substrate W thereon. The controller 180 also controls the flow controller 154 to supply an excitation gas (for example, argon gas) into the processing chamber 110. Further, the controller 180 controls the power supply 133 to apply a negative DC voltage to the holder 131 holding the targets T1 and T2. As a result, ions in the excitation gas dissociated around the targets T1 and T2 collide with the targets T1 and T2, and sputter particles are emitted from the targets T1 and T2 into the internal space 110*a*. As a result, sputter particles adhere (deposit) to the substrate W, and a film is formed on the substrate W.

Further, during the film formation processing, the controller 180 controls the operation portion 172 to oscillate (reciprocate) the magnet 171. Thereby, plasma is induced by the magnetic field of the magnet 171. In other words, by controlling the oscillation width of the magnet 171, the sputter electrical discharge regions of the targets T1 and T2 are controlled.

When the film formation processing is completed, the controller 180 controls the flow controller 154 to stop supplying an excitation gas. In addition, the controller 180 controls the power supply 133 to stop applying voltage to the holder 131. Further, the controller 180 controls the support driving portion 122 to stop the rotation of the mounting table 121. Next, the controller 180 controls the support driving portion 122 to lower the mounting table 121 to a predetermined position. Further, the controller 180 controls the power supply (not shown) of the electrostatic chuck 121*b* to release electrostatic adsorption. The controller 180 opens the gate valve 112. The substrate W is unloaded from the processing chamber 110 through the loading/unloading port 111 by the transport device (not shown). When the transport device retreats from the loading/unloading port 111, the controller 180 closes the gate valve 112.

As described above, the film forming apparatus 100 emits sputter particles from the targets T1 and T2, adheres the sputter particles to the surface of the substrate W, and forms a film.

Figure 3:
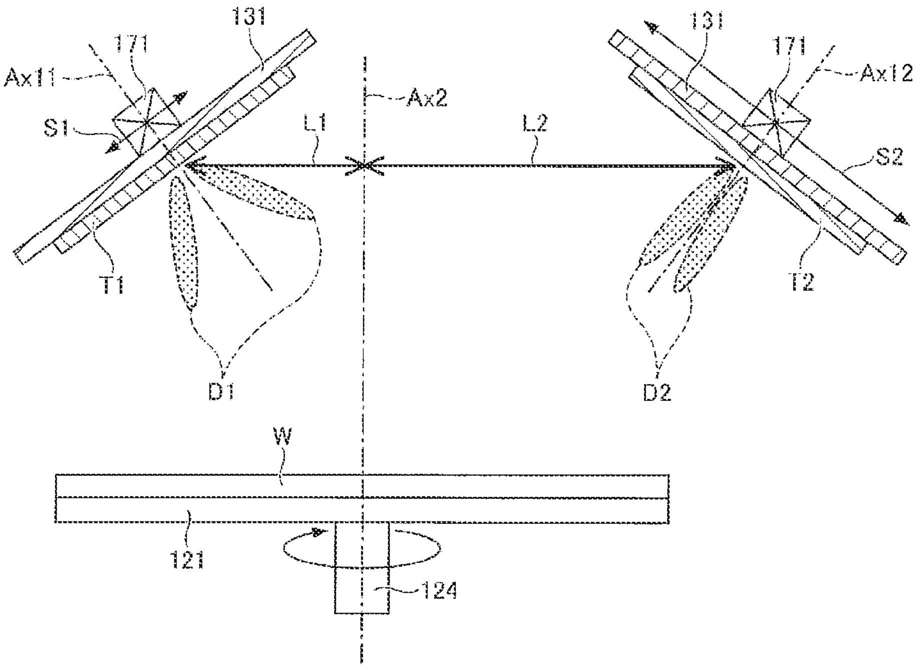
FIG. 3 is an example of a schematic cross-sectional view for explaining the arrangement of a target and a mounting table.

Next, the disposition of the targets T1 and T2 and the mounting table 121 will be further explained with reference to FIG. 3. FIG. 3 is an example of a schematic cross-sectional view for explaining the disposition of the targets T1 and T2 and the mounting table 121.

Herein, a central axis Ax11 is an axis passing through the center of a sputter surface of the target T1 and perpendicular to the sputter surface of the target T1. A central axis Ax12 is an axis passing through the center of a sputter surface of the target T2 and perpendicular to the sputter surface of the target T2. In addition, a distance (horizontal distance) from the center of the sputter surface of the target T1 to the central axis Ax2 of the mounting table is defined as a distance L1. A distance (horizontal distance) from the center of the sputter surface of the target T2 to the central axis Ax2 of the mounting table is defined as a distance L2.

In addition, an oscillation width of the magnet 171 corresponding to the target T1 is defined as an oscillation width S1. An oscillation width of the magnet 171 corresponding to the target T2 is defined as an oscillation width S2. In addition, as described above in FIG. 2, the moving direction of the magnet 171 is a longitudinal direction of the targets T1 and T2 (a direction perpendicular to the ground in FIG. 1 and a vertical direction of the ground in FIG. 2). However, in FIG. 3, the target T1, the holder 131, and the magnet 171 are rotated by 90° around the central axis Ax11 to schematically illustrate the oscillation width S1. In addition, the target T2, the holder 131, and the magnet 171 are rotated by 90° around the central axis Ax12 to schematically illustrate the oscillation width S2.

Further, an angle distribution D1 in which silicon (Si) is sputtered and emitted from the target T1 is shown. An angle distribution D2 in which tungsten (W) is sputtered and emitted from the target T2 is shown.

Herein, as shown in FIG. 2, the magnet 171 has an N pole disposed on the inside and an S pole disposed on the outside. By magnetic fields formed based on the disposition of the magnet 171, the emission angle distribution of sputter particles forms an angle distribution having two ridges as shown in FIG. 3.

In addition, as shown in FIG. 3, the emission angle distribution of sputter particles differs depending on a target material. Herein, the emission angle distribution of the sputter particles is defined as an opening angle of peaks of two ridges in the angle distribution having the two ridges of the sputter particles emitted from the targets T1 and T2. In other words, the closer the peaks of the two ridges are to the normal line direction of a sputter surface, the smaller the opening angle of the peaks of the two ridges and the smaller the emission angle distribution of the sputter particles. In the example shown in FIG. 3, the emission angle distribution of the target T1 made of silicon (Si) is larger than the emission angle distribution of the target T2 made of tungsten (W) (Radiation angle distribution of sputter particles of target T1>Radiation angle distribution of sputter particles of target T2). Further, the emission angle distribution (opening angle) is defined by the material of a target.

The angle distribution D1 of silicon (Si) has a high frequency in a direction inclined with respect to the normal line direction (central axis Ax11) of the sputter surface of the target T1. In other words, silicon (Si) is emitted in a direction inclined from the normal line direction of the sputter surface of the target T1.

On the other hand, the angle distribution D2 of tungsten (W) has a high frequency in the normal line direction (central axis Ax12) of the sputter surface of the target T2. In other words, tungsten (W) is emitted in the normal line direction to the sputter surface of the target T2.

Accordingly, in the configuration of the film forming apparatus in which the target central axis Ax1 (see FIG. 1) and the mounting table central axis Ax2 (see FIGS. 1 and 2) are disposed in the same linear shape, the film of a compound deposited on the substrate W is biased depending on the material of a target, and it is difficult to achieve both in-plane uniformity of a film thickness and in-plane uniformity of a composition.

On the other hand, in the film forming apparatus 100 of the present embodiment, as shown in FIG. 1, the target central axis Ax1 and the mounting table central axis Ax2 are disposed so as not to coincide with each other, that is, not to form the same linear shape. In other words, the mounting table central axis Ax2 is horizontally offset with respect to the target central axis Ax1.

Specifically, when the emission angle distribution of the sputter particles of the target T1 is larger than the emission angle distribution of the sputter particles of the target T2, a distance L1 is disposed to be smaller (shorter) than the distance L2 as shown in FIG. 3 (L1<L2).

Further, when the emission angle distribution of the sputter particles of the target T1 is larger than the emission angle distribution of the sputter particles of the target T2, as shown in FIGS. 2 and 3, the controller 180 controls each operation portion 172 such that the oscillation width S1 of the magnet 171 corresponding to the target T1 becomes smaller than the oscillation width S2 of the magnet 171 corresponding to the target T2 (S1<S2). In other words, when the emission angle distribution of the target T1 is smaller than the emission angle distribution of the target T2, the sputter electrical discharge region of the target T1 is controlled to be smaller than the sputter electrical discharge region of the target T2.

Herein, when the horizontal distance from the center of the sputter surface of the target to the mounting table central axis Ax1 is shortened, the optimal distance of a distance TS in a height direction between the center of the substrate W and the center of the sputter surface of the target is shortened. Accordingly, in the target T1 made of a material having a wide emission angle distribution of sputter particles, while maintaining the distance TS in the height direction between the center of the substrate W and the center of the sputter surface of the target, when the horizontal distance L1 from the center of the sputter surface of the target to the mounting table central axis Ax2 is shortened, the properties of the film formed on the substrate W (film thickness, in-plane uniformity of composition) are close to the properties of the film formed on the substrate W (film thickness, in-plane uniformity of composition) by a material having a narrow emission angle distribution of sputter particles. In addition, in the target T2 made of a material having a narrow emission angle distribution of sputter particles, while maintaining the distance TS in the height direction between the center of the substrate W and the center of the sputter surface of the target, when the horizontal distance L2 from the center of the sputter surface of the target to the mounting table central axis Ax2 is lengthened, the properties of the film formed on the substrate W (film thickness, in-plane uniformity of composition) are close to the properties of the film formed on the substrate W (film thickness, in-plane uniformity of composition) by a material having a wide emission angle distribution of sputter particles.

Accordingly, by disposing the targets T1 and T2 and the mounting table 121 so that the distance L1 is smaller (shorter) than the distance L2, the film thickness and in-plane uniformity of composition can be improved in a film forming apparatus that simultaneously sputters the targets T1 and T2 of different materials.

Further, the oscillation widths S1 and S2 of the magnet 171 are controlled so as to narrow the sputter electrical discharge region of the target T1 having a wide emission angle distribution of sputter particles and widen the sputter electrical discharge region of the target T2 having a narrow emission angle distribution of sputter particles. As a result, the film thickness and in-plane uniformity of composition can be improved in a film forming apparatus that simultaneously sputters the targets T1 and T2 of different materials.

Further, although it has been described that in the film forming apparatus 100 of the present embodiment, when the emission angle distribution of the target T1 is larger than the emission angle distribution of the target T2, the distance L1 is smaller (shorter) than the distance L2, and the oscillation width S1 is smaller than the oscillation width S2, it is not limited thereto, and only either one may be used. In other words, when the emission angle distribution of the target T1 is larger than the emission angle distribution of the target T2, the distance L1 may be smaller (shorter) than the distance L2. Further, when the emission angle distribution of the target T1 is larger than the emission angle distribution of the target T2, the oscillation width S1 may be smaller than the oscillation width S2.

In addition, the film forming apparatus 100 may include a movement mechanism (not shown) that horizontally moves the mounting table 121 (stage mechanism portion 120) so that the mounting table central axis Ax2 may be moved with respect to the target central axis Ax1. Further, the film forming apparatus 100 may include a movement mechanism (not shown) that moves the target holding portion 130 and the magnet mechanism portion 170 with respect to the mounting table central axis Ax2. For example, a movement mechanism that moves the target holding portion 130 and the magnet mechanism portion 170 in a direction perpendicular to the oscillation direction of the magnet 171 (the tangent line direction of the virtual circle ic) may be provided.

In addition, although it has been described that the target T1 is made of a silicon (Si) material and the target T2 is made of a tungsten (W) material, they are not limited thereto. The targets T1 and T2 may be made of other materials.

In addition, although the film forming apparatus 100 has been described as having two target holding portions 130 as an example, it is not limited thereto and may be provided with three or more.

Figure 4:
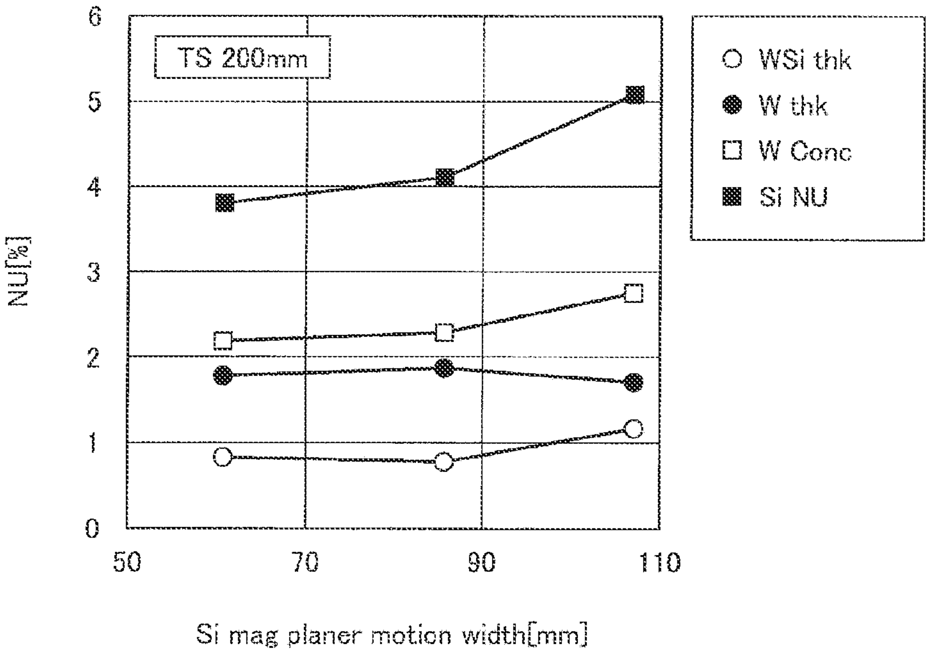
FIG. 4 is a graph showing an example of film formation results.

Next, an example of film formation by the film formation apparatus 100 will be described with reference to FIG. 4. FIG. 4 is a graph showing an example of film formation results. Herein, the distance (TS) in a height direction between the center of the substrate W and the center of the sputter surfaces of the targets T1 and T2 is 200 mm, and the targets T1 and T2 are simultaneously sputtered to form a tungsten silicide film on the substrate W. The horizontal axis indicates the oscillation width S1 of the magnet 171 of the target T1. A black square indicates the non-uniformity of a silicon film thickness (Si NU). A white square indicates the non-uniformity of the concentration (composition ratio) of tungsten of a tungsten silicide film (W Conc). A black circle indicates the film thickness of a tungsten film (W thk). A white circle indicates the film thickness of a tungsten silicide film (WSi thk).

As shown in the silicon film thickness (Si NU) indicated by black squares, the in-plane uniformity of the silicon film thickness improves as the oscillation width S1 of the magnet 171 corresponding to the target T1 decreases.

Further, as shown in the concentration (composition ratio) (W Conc) of tungsten in the tungsten silicide film indicated by white squares, the in-plane uniformity of the composition improves as the oscillation width S1 of the magnet 171 corresponding to the target T1 decreases.

In addition, the film thickness (W thk) of the tungsten film indicated by black circles does not change with the oscillation width S1 of the magnet 171 corresponding to the target T1.

In addition, as shown in the film thickness (WSi thk) of the tungsten silicide film indicated by white circles, the non-uniformity is degraded as the oscillation width S1 of the magnet 171 corresponding to the target T1 decreases. In other words, the in-plane uniformity of the film thickness of the tungsten silicide film is improved.

It should be noted that other elements may be combined with the configurations in the above embodiments, and the present disclosure is not limited to the configurations shown herein. In this respect, it is possible to make changes within the range without departing from the gist of the present disclosure. It is also possible to determine appropriately according to the application form.

The invention claimed is:

1. A film forming apparatus, comprising:

a first holder holding a first target formed of a first material;

a second holder holding a second target formed of a second material different from the first material;

a mounting table holding a substrate, the mounting table rotatable with a central axis of the mounting table as a rotation axis;

a first magnet that oscillates on a back surface side of the first holder; and a second magnet that oscillates on a back surface side of the second holder; and a controller that controls an oscillation of the first magnet and the second magnet, wherein the controller includes a processor and a memory storing instructions thereon, the instructions when executed by the processor cause the processor to:

control an oscillation width of the first magnet and an oscillation of the second magnet such that, when an emission angle distribution of sputtered particles emitted from the first target is larger than an emission angle distribution of sputtered particles emitted from the second target, the oscillation width of the first magnet is smaller than the oscillation width of the second magnet to narrow a sputtering discharge region of the first target and to widen a sputtering discharge region of the second target.

2. The film forming apparatus of claim 1, wherein a distance from the central axis of the mounting table to a center of a sputter surface of the first target is smaller than a distance from the central axis of the mounting table to a center of a sputter surface of the second target.

3. The film forming apparatus of claim 1, further comprising:

a gas supply portion that supplies an excitation gas;

a first power supply that applies a voltage to the first holder; and a second power supply that applies a voltage to the second holder.

4. A method of controlling a film forming apparatus comprising a first holder holding a first target formed of a first material, a second holder holding a second target formed of a second material different from the first material, a mounting table that holds a substrate and is rotatable with a central axis of the mounting table as a rotation axis, a first magnet that oscillates on a back surface side of the first holder, a second magnet that oscillates on a back surface side of the second holder, a first reciprocating mechanism that oscillates the first magnet, and a second reciprocating mechanism that oscillates the second magnet, the method comprising controlling the first reciprocating mechanism and the second reciprocating mechanism such that, when an emission angle distribution of sputtered particles emitted from the first target is larger than an emission angle distribution of sputtered particles emitted from the second target, an oscillation width of the first magnet is smaller than an oscillation width of the second magnet to narrow a sputtering discharge region of the first target and to widen a sputtering discharge region of the second target.

* * * * *